(12) United States Patent
Tse-Peng

(10) Patent No.: US 8,275,336 B2
(45) Date of Patent: Sep. 25, 2012

(54) APPARATUS AND METHOD FOR DIGITALLY CONTROLLING CAPACITANCE

(75) Inventor: Chen Tse-Peng, Taipei (TW)

(73) Assignee: Richwave Technology Corp., Taipei (TW)

( * ) Notice: Subject to any disclaimer, the term of this patent is extended or adjusted under 35 U.S.C. 154(b) by 191 days.

(21) Appl. No.: 12/821,489

(22) Filed: Jun. 23, 2010

(65) Prior Publication Data

US 2011/0319036 A1    Dec. 29, 2011

(51) Int. Cl.
*H04B 1/06*    (2006.01)
*H04B 7/00*    (2006.01)

(52) U.S. Cl. .............. 455/260; 455/196.1; 455/197.1; 455/197.2; 455/197.3; 455/255; 455/258; 455/259; 455/261; 455/262; 455/264; 455/318; 331/34; 331/36 R; 331/36 C; 331/117 R; 331/117 FE; 331/177 R; 331/177 V

(58) Field of Classification Search .......... 455/255–265, 455/318–320, 196.1, 197.1–197.3; 331/117 R, 331/117 FE, 117 D, 167, 177 R, 177 V, 34, 331/36 R, 36 C
See application file for complete search history.

(56) References Cited

U.S. PATENT DOCUMENTS

| | | | | |
|---|---|---|---|---|
| 4,694,262 A | | 9/1987 | Inoue et al. | |
| 6,002,303 A | * | 12/1999 | Carralero et al. | 331/117 R |
| 6,060,956 A | * | 5/2000 | Mole et al. | 331/117 R |
| 6,140,884 A | * | 10/2000 | Harpham et al. | 331/117 R |
| 6,147,567 A | * | 11/2000 | Welland et al. | 331/179 |
| 6,226,506 B1 | * | 5/2001 | Welland et al. | 455/260 |
| 6,236,843 B1 | * | 5/2001 | Goto | 455/260 |
| 6,268,778 B1 | * | 7/2001 | Mucke et al. | 331/117 R |
| 6,940,358 B1 | * | 9/2005 | Meacham | 331/117 R |
| 7,084,713 B2 | * | 8/2006 | Peluso | 331/179 |
| 7,230,504 B1 | * | 6/2007 | Marques et al. | 331/117 FE |
| 7,518,458 B2 | * | 4/2009 | Nakamura et al. | 331/167 |
| 7,643,809 B1 | * | 1/2010 | Meacham | 455/193.2 |
| 7,869,780 B2 | * | 1/2011 | Youssoufian et al. | 455/222 |
| 8,019,301 B2 | * | 9/2011 | Dunworth et al. | 455/260 |

* cited by examiner

*Primary Examiner* — Tuan A Tran
(74) *Attorney, Agent, or Firm* — Edell, Shapiro & Finnan, LLC

(57) ABSTRACT

An oscillator circuit having a source of an oscillating signal, a tank circuit including an inductor and a capacitor, and a discretely switchable capacitance module configured to control an amount of capacitance in the oscillator circuit. The discretely switchable capacitance module includes, in one embodiment, a capacitor coupled between a first node and a second node, a switch, having a control node, coupled between the second node and a third node; and a DC feed circuit, having a first end coupled to the second node and a second end configured to receive a first or second control signal. The control node of the switch is tied to a predetermined bias voltage. When the first control signal is applied, the capacitor is coupled between the first node and the third node via the switch such that the capacitor is coupled in parallel with the capacitor of the tank circuit, and when the second control signal is applied the capacitor is decoupled from the tank circuit.

30 Claims, 4 Drawing Sheets

APPARATUS AND METHOD FOR DIGITALLY CONTROLLING CAPACITANCE

FIELD OF THE INVENTION

The present invention relates to an oscillation circuit. More particularly, the present invention relates to a voltage controlled oscillator with digitally controlled application of discrete amounts capacitance.

BACKGROUND OF THE INVENTION

Many wireless devices such as mobile telephones require oscillation circuits to generate high frequency signals that may be mixed with incoming received signals and mixed with outgoing signals to be transmitted. In the case of mobile telephony, a given mobile telephone might have to operate across a broad range of frequencies or channels in order to avoid interfering with other mobile telephones.

To provide this broad range of frequencies, a frequency synthesizer is often employed. A frequency synthesizer typically includes a controlled oscillator circuit, such as a voltage controlled oscillator (VCO) that receives a control voltage or signal and, in response thereto, alters or shifts the frequency of the VCO signal output to a desired frequency.

In some implementations an oscillator will employ a tuned circuit comprising an inductor (L) and capacitor (C) to provide an LC tank circuit that is resonant at a particular frequency. In order to change or shift the frequency of the signal, the inductance and/or the capacitance can be changed. One way to do this, for example, is to connect, in parallel with the capacitor of the LC tank circuit, a voltage-variable capacitor (i.e., a varactor) whose capacitance changes in the presence of an applied voltage. Thus, when the control voltage changes, the capacitance of the overall LC tank circuit changes, and, as a result, so does the resonant frequency of the LC circuit, thus causing a change in output frequency.

While such VCO implementations can be used in many applications, such circuits cannot typically be used in applications such as mobile telephony, in which very precise and discrete signal frequencies are needed to, among other purposes, avoid the potential for interference mentioned above. Accordingly, digitally controlled discrete addition of capacitance has become increasingly popular in modern frequency synthesizers.

SUMMARY OF THE INVENTION

An object of the embodiments described herein is to provide selective application of discrete amounts of capacitance to an electrical circuit, such as an oscillator circuit. In one embodiment there is provided an oscillator circuit, comprising an amplifier, a tank circuit comprising an inductor and a capacitor, and a discretely switchable capacitance module configured to control an amount of capacitance in the oscillator circuit. The discretely switchable capacitance module has a capacitor coupled between a first node and a second node, a switch, having a control node, coupled between the second node and a third node, and a DC feed circuit, having a first end coupled to the second node and a second end configured to receive a first control signal or a second control signal. The DC feed circuit could be a resistor or an inductor, and is used to apply the first or second control signal (which is a DC signal) to the second node and prevent output signal of the amplifier (which is an AC signal) to pass from first node to second end through the capacitor, and thus prevent a loading effect from the second end of the DC feed circuit. The control node of the switch is tied to a predetermined bias voltage.

When the first control signal is applied to the second end of the DC feed circuit, the capacitor is coupled between the first node and the third node via the switch such that the capacitor is coupled in parallel with the capacitor of the tank circuit, and when the second control signal is applied to the second end of the DC feed circuit the capacitor is decoupled from the tank circuit.

In another embodiment, there is provided an apparatus for controlling an amount of capacitance in an oscillator circuit, comprising a first capacitor coupled between a first node and a second node, a second capacitor coupled between a third node and a fourth node, a switch, having a control node, coupled between the second node and the fourth node, a first DC feed circuit, having a first end coupled to the second node and a second end configured to receive a control signal, and a second DC feed circuit, having a first end coupled to the fourth node and a second end configured to receive the control signal. The control node of the switch is configured to be tied to a predetermined bias voltage.

When a first control signal is applied to the second ends of the first and second DC feed circuits, the first capacitor and the second capacitor are coupled between the first node and the third node via the switch, and when a second control signal is applied to the second ends of the DC feed circuits the first capacitor and the second capacitor are decoupled from between the first node and the third node.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENTS

Figure 1:
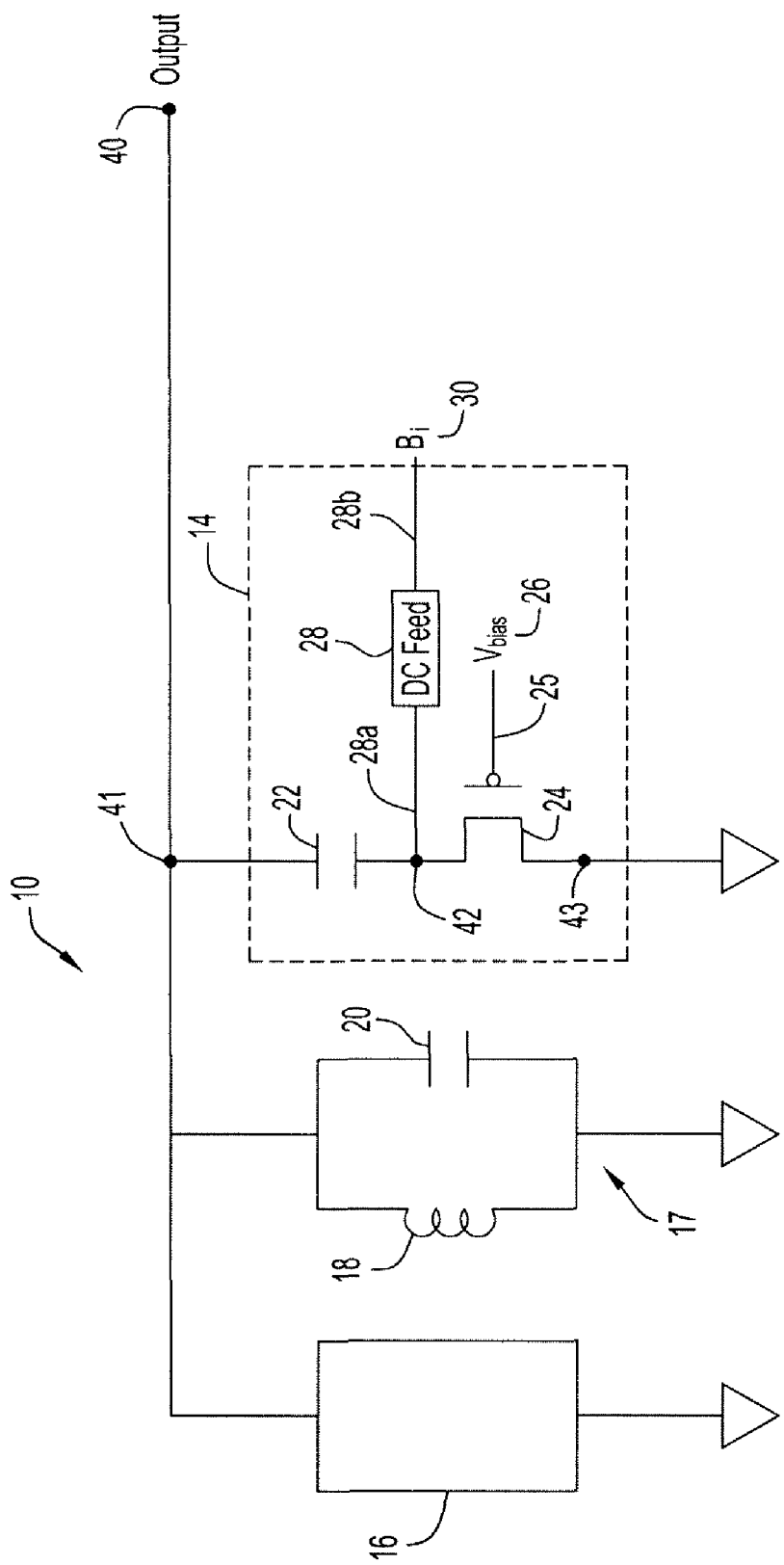
FIG. 1 shows a discretely switchable capacitance module according to a first embodiment of the present invention.
Figure 2:
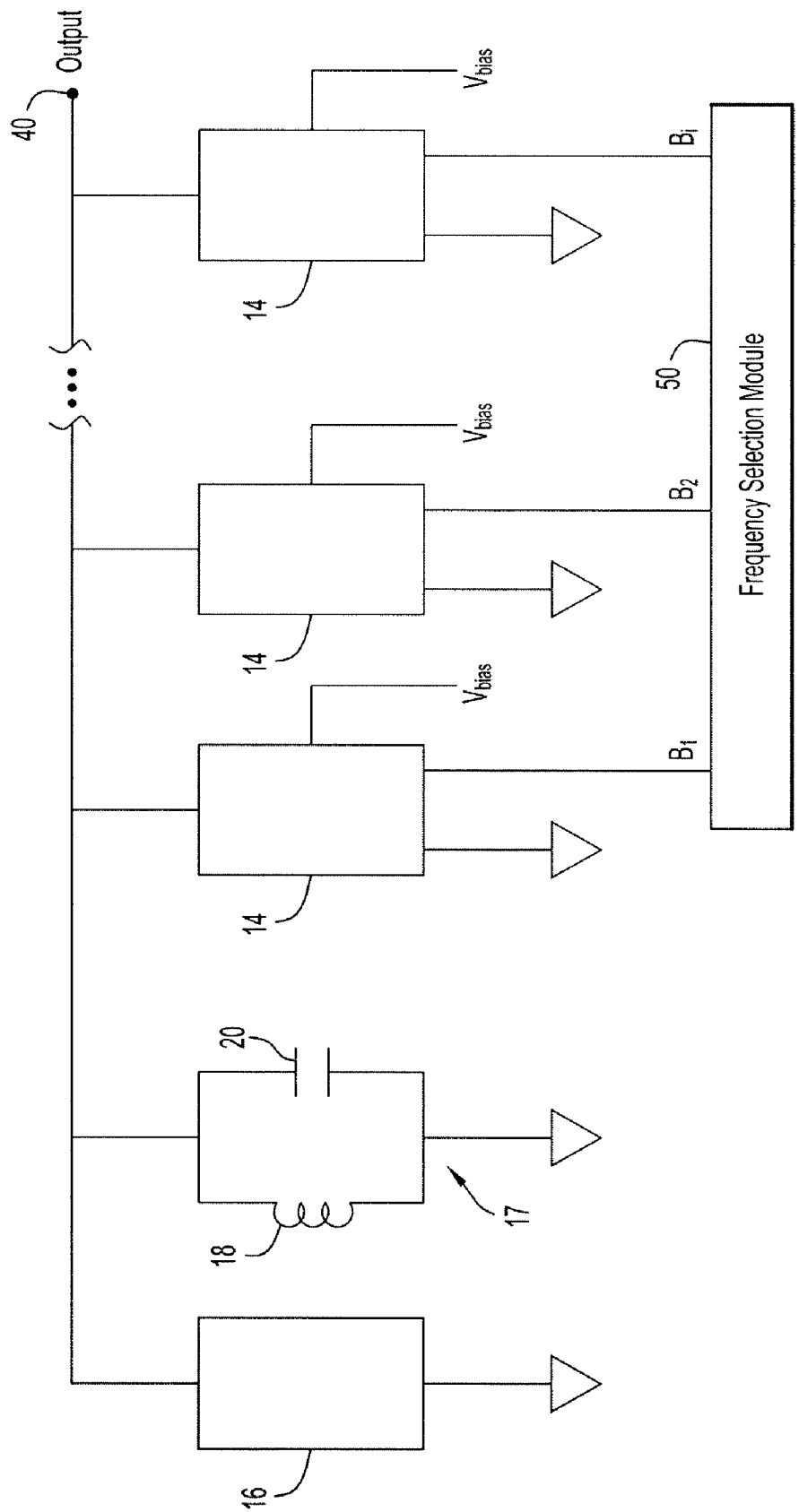
FIG. 2 shows a plurality of discretely switchable capacitance modules arranged together and controlled by a frequency selection module.

Referring to FIG. 1, there is shown a first embodiment of the present invention. An oscillator circuit 10, which may be part of an overall frequency synthesizer (which itself may be a component of a wireless communication device such as a mobile telephone) is shown that comprises an amplifier 16 that provides a source of oscillation. Amplifier 16 may be based on any number of designs known to those skilled in the art. An LC tank circuit 17 comprising an inductor 18 and a capacitor 20 provides an initial or default means for setting a frequency of oscillation. As will be explained below, additional capacitance can be selectively added via a discretely switchable capacitance module 14, a plurality of which may be provided as shown in FIG. 2.

More specifically, each discretely switchable capacitance module 14 includes a capacitor 22 electrically connected or coupled between a first node 41 and a second node 42. A switch 24, such as a PMOS FET, is coupled between the second node 42 and a third node 43. In this case, the source of the PMOS FET 24 is connected to the second node 42 and the drain of the PMOS FET is connected to the third node 43. Further, in the embodiment shown in FIG. 1, the third node 43 is at ground potential. Switch 24 includes a control node 25, namely the gate terminal of the PMOS FET 24.

As is well known in the art, when a voltage of appropriate magnitude is applied to the gate, and a control voltage is applied to the source of a PMOS FET, the PMOS FET is turned on and effectively functions, when in its active region, as a short circuit between its source and drain terminals. When the source or control voltage is removed, the MOS FET acts as an open circuit between its source and drain terminals. In the embodiment shown in FIG. 1, the control node 25 of switch 24 is supplied with a constant voltage Vbias 26.

As still further shown in FIG. 1, discretely switchable capacitance module 14 further includes a DC feed circuit 28 that has a first end 28a connected to the second node 42. A second end 28b of the DC feed circuit 28 is configured to receive a control signal Bi 30, the function of which is explained next. This DC feed circuit can apply control signal Bi 30 (which is a DC signal) to the source terminal of PMOS FET 24 and prevent output signal 40 (which is an AC signal) to pass from first node 41 to control signal Bi through capacitor 22, and thus prevent a loading effect from Bi.

Control signal Bi 30 is used, in conjunction with Vbias 26 (e.g. 0.9 volts), to control whether or not capacitor 22 is electrically connected in parallel with the capacitor 20 of LC tank circuit 17. More specifically, if Bi is HI (e.g., 1.8 volts) then $V_{GS}$ on PMOS FET switch 24 is lower than a minimum amount ($V_{TH}$), thus making the switch 24 conductive. As such, capacitor 22 is coupled between the first node 41 and the third node 43, which is ground in this embodiment. Because the capacitor 20 in the LC tank circuit 17 is also coupled between the first node 41 and ground, these two capacitances 20, 22 are arranged in parallel with one another and thus the capacitance of capacitor 22 is added to the capacitance of the capacitor 20 in the LC tank circuit 17.

In contrast, when Bi is LO (e.g., 0 volts, or ground), $V_{GS}$ is greater than a minimum amount ($V_{TH}$), thus making the PMOS FET switch 24 un-conductive, and the capacitance of capacitor 22 does not influence the overall capacitance of the LC tank circuit 17. When Bi is LO, the capacitor 22 is said to be de-coupled from the resonant tank circuit 17.

Thus, by applying a constant Vbias voltage 26 to the control terminal of the switch 24 and by selectively applying a control signal Bi 30 to, in this case, the source terminal of switch 24, it is possible to modify the capacitance of the LC tank circuit 17 and thus shift the frequency of an output signal at output 40 of the oscillator 10.

FIG. 2 shows a plurality of discretely switchable capacitance modules 14 arranged together and controlled by a frequency selection module 50. As shown, in this embodiment, the same Vbias voltage 26 is applied to each module and, more specifically, the control terminal, e.g., gate terminal, of its respective switch 24. The frequency selection module 50 outputs a digital word having a length equal to the number of discretely switchable capacitance modules 14 present in the circuit. Thus, in the simplified illustration of FIG. 2, a digital word of "110" would enable the first two discretely switchable capacitance modules 14, but leave un-conductive the switch in the third discretely switchable capacitance modules 14. That is, the capacitor in the third discretely switchable capacitance module 14 is de-coupled from the circuit. As a result, the capacitance of the respective capacitors in the enabled modules 14 is added to the capacitance of the capacitor of the LC tank circuit 17. This change in capacitance shifts the frequency of the oscillation signal at output 40. The number of individual discretely switchable capacitance modules 14 implemented will depend on the particular application. Further, the value of capacitance in each discretely switchable capacitance module 14 need not be identical, such that the enabling of a first discretely switchable capacitance module 14 may shift the frequency of the output signal more than the enabling of a second discretely switchable capacitance module 14.

Figure 3:
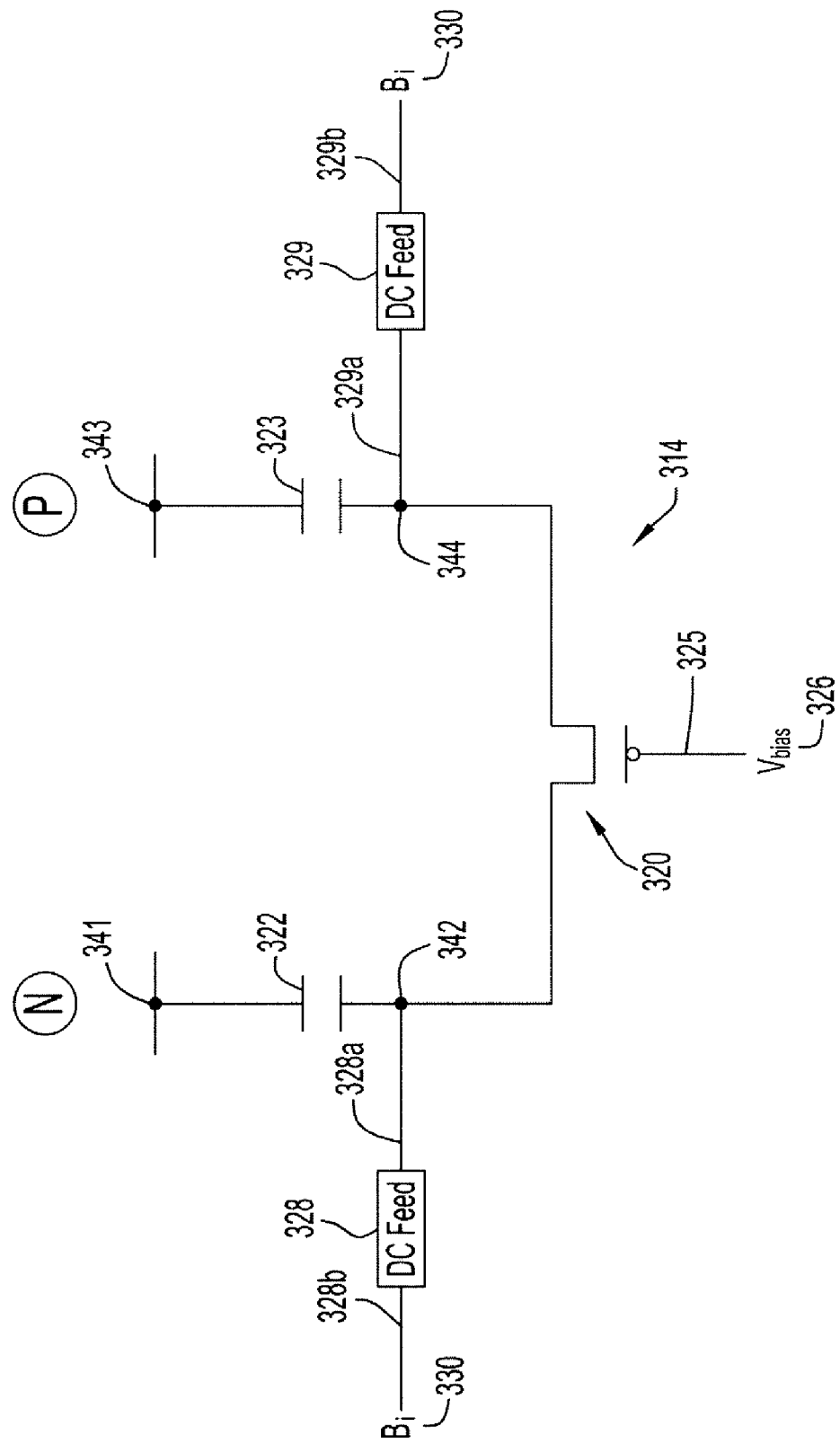
FIG. 3 shows a differential discretely switchable capacitance module in accordance with a second embodiment of the invention.
Figure 4:
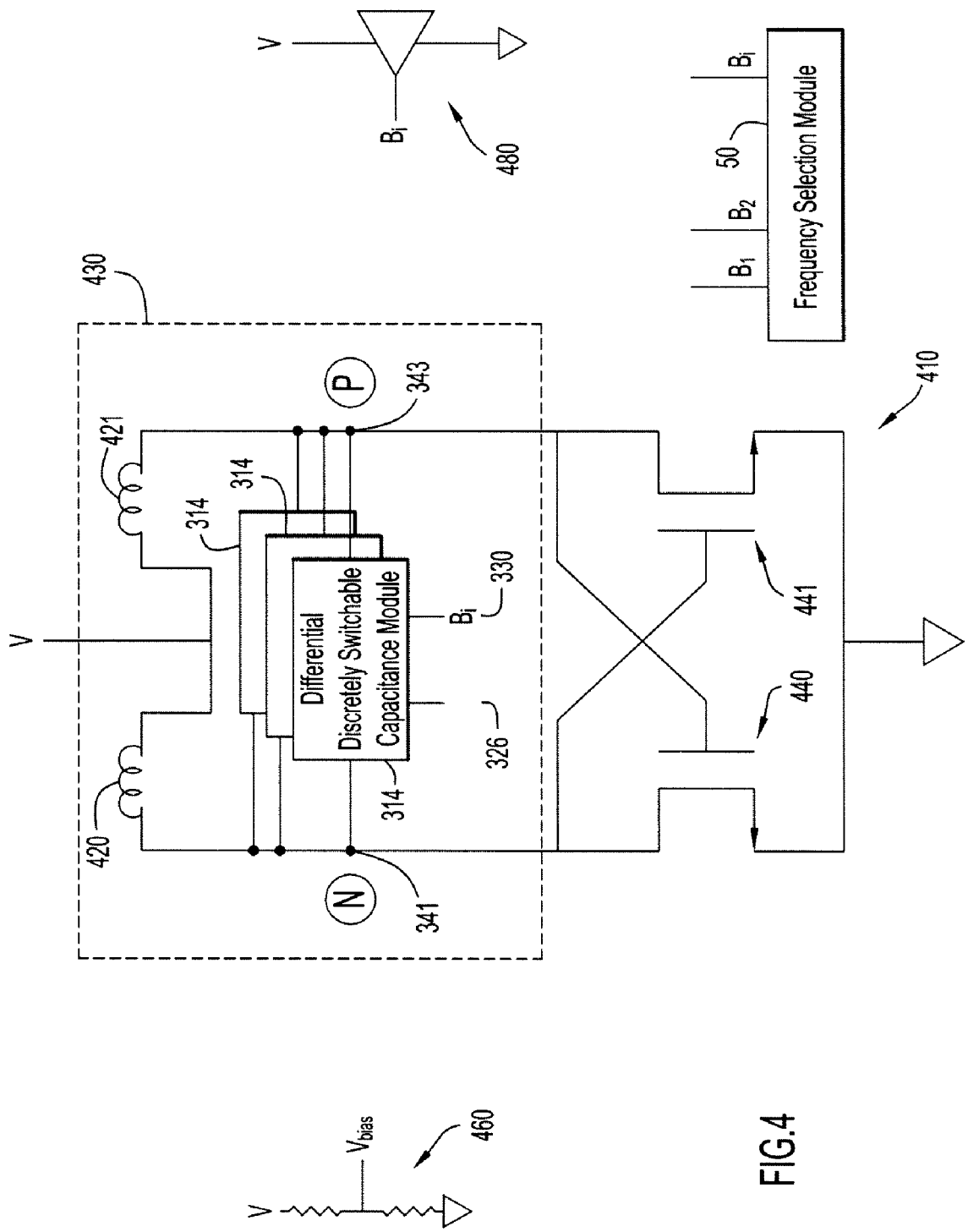
FIG. 4 shows a plurality of differential discretely switchable capacitance modules arranged together and controlled by a frequency selection module in accordance with the second embodiment of the present invention.

FIG. 3 shows a differential discretely switchable capacitance module 314 in accordance with a second embodiment of the invention. Like the first embodiment in which multiple or a plurality of discretely switchable capacitance modules 14 may be employed as shown in FIG. 2, multiple or a plurality of differential discretely switchable capacitance modules 314 may be employed as shown in FIG. 4.

Referring back to FIG. 3, the differential discretely switchable capacitance module 314 includes a negative side capacitor 322 coupled between a first node 341 and a second node 342. A positive side capacitor 323 is coupled between a third node 343 and a fourth node 344. Further, a switch 320, such as a PMOS FET (or NMOS), has, e.g., a drain terminal coupled to the second node 342 and a source terminal coupled to the fourth node 344. A voltage Vbias is applied to a control node 325, e.g., a gate terminal, of the switch 320. Vbias 326 may be, for example, 0.9 volts in this embodiment.

A DC feed circuit 328 has a first end 328a coupled to the second node 342 and a second end 328b to which a control signal Bi 330 is applied. A DC feed circuit 329 has a first end 329a coupled to the fourth node 344 and a second end 329b to which the control signal Bi 330 is also applied.

In operation, an oscillating signal passes through switch 320 when Bi 330 is applied to second ends 328b, 329b of DC feed circuits 328, 329 and when Vbias is applied to the gate of switch 320. In this mode of operation the capacitors 322, 323 are arranged in series with one another. In this embodiment, Bi is HI (NMOS: set to LO, e.g. 0V), then $V_{GS}$ on PMOS FET (NMOS) switch 24 is lower (NMOS:greater) than a minimum amount ($V_{TH}$), thus making the switch 24 conductive. Thus, in one embodiment, the magnitude of Bi may be, e.g., 1.8 volts.

In contrast, when Bi is set to LO, e.g., zero volts (NMOS: set to HI, e.g. 1.8V), even as Vbias 326 is maintained at the gate terminal of the switch 320, $V_{GS}$ on PMOS FET (NMOS) switch 24 is greater (NMOS: lower) than a minimum amount ($V_{TH}$), thus making the switch 24 un-conductive. Therefore, no signal passes through switch 320 and thus capacitors 322, 323 have no effect on any associated outside circuit. That is, capacitors 322, 323 are de-coupled from the circuit.

Reference is again made to FIG. 4 in which multiple differential discretely switchable capacitance modules 314 are arranged in parallel with one another in an overall oscillator circuit 410. As shown, differential discretely switchable capacitance modules 314 are coupled between negative N and positive P nodes 341, 343, which correspond to the first and third nodes 341, 343 described with respect to FIG. 3. Each differential discretely switchable capacitance module 314 receives as input a Vbias voltage and control signal Bi 330. One side of each inductor 420, 421 is coupled to nodes 342, 343, respectively, and the other sides of inductors 420, 421 are coupled together and receive a power supply voltage V. In one possible implementation, inductors 420, 421 each have a value of half of the total inductance that is desired for oscillator 410.

As further shown, an amplifier comprises cross-connected transistors 440, 441. An LC tank circuit 430 is comprised of the inductors 420, 421 and as much capacitance provided by coupled capacitance within enabled differential discretely switchable capacitance modules 314. The output of oscillator 410 can be taken across nodes 341, 343.

As still further shown in FIG. 4, Vbias for both the first embodiment and the second embodiment may be supplied by a voltage divider network 460, and Bi for both embodiments can be supplied from a digital buffer as shown at 480.

As in the first embodiment, a frequency selection module 50 may be provided to output a digital word to control which ones of the differential discretely switchable capacitance modules 314 are to be made part of the LC tank circuit 430 and thus determine the output frequency of the oscillator 410.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. An oscillator circuit having at least one output frequency, the output frequency changing as a capacitance in the oscillator circuit varies, the oscillator circuit comprising:
   a discretely switchable capacitance module configured to control an amount of the capacitance in the oscillator circuit, the discretely switchable capacitance module having
      a capacitor coupled between a first node and a second node;
      a switch, having a control node, coupled between the second node and a third node; and
      a DC-feed circuit, having a first end coupled to the second node and a second end configured to receive a first control signal or a second control signal,
   wherein the control node of the switch is tied to a predetermined bias voltage, and when the first control signal is applied to the second end of the DC feed circuit an AC signal of the oscillator circuit passes through the capacitor, and when the second control signal is applied to the second end of the DC feed circuit the AC signal of the oscillator circuit does not pass through the capacitor and the switch.

2. The oscillator circuit of claim 1, wherein a magnitude of the first control signal is less than a magnitude of an output signal of the oscillator circuit.

3. The oscillator circuit of claim 1, wherein the first node is coupled to an output of the oscillator.

4. The oscillator circuit of claim 1, wherein the third node is coupled to ground.

5. The oscillator circuit of claim 1, wherein the predetermined bias voltage is sufficient to turn the switch on.

6. The oscillator circuit of claim 1, further comprising a frequency selection module configured to output a multi-bit control word for controlling a plurality of discretely switchable capacitance modules, wherein each bit of the multi-bit control word provides, at a given time, one of the first control signal or the second control signal to a respective discretely switchable capacitance module.

7. A method of controlling an amount of capacitance in an oscillator circuit, comprising:
   applying a predetermined bias voltage to a control node of a switch, the switch being coupled between ground and a first node of a capacitor, wherein a second node of the capacitor is coupled to an output of the oscillator circuit; and
   selectively applying, through a first end of a DC feed circuit having its second end coupled to the first node of the capacitor, a first control signal that causes an AC signal of the oscillator circuit to pass through the capacitor and the switch, and a second control signal that causes the AC signal of the oscillator circuit not to pass through the capacitor and the switch.

8. The method of claim 7, further comprising setting a magnitude of the first control signal to be less than a magnitude of an output signal of the oscillator circuit.

9. The method of claim 7, further comprising applying a multi-bit control word to a plurality of discretely switchable capacitance modules, wherein each bit of the multi-bit control word provides at a given time one of the first control signal or the second control signal to a respective one of discretely switchable capacitance modules.

10. An apparatus for controlling an amount of capacitance in an oscillator circuit, comprising:
    a first capacitor coupled between a first node and a second node;
    a second capacitor coupled between a third node and a fourth node;
    a switch, having a control node, coupled between the second node and the fourth node;
    a first DC feed circuit, having a first end coupled to the second node and a second end configured to receive a control signal; and
    a second DC feed circuit, having a first end coupled to the fourth node and a second end configured to receive the control signal,
    wherein the control node of the switch is configured to be tied to a predetermined bias voltage, and when a first control signal is applied to the second ends of the first and second DC feed circuits, the first capacitor and the second capacitor are coupled between the first node and the third node via the switch, and when a second control signal is applied to the second ends of the DC feed circuits the first capacitor and the second capacitor are decoupled from between the first node and the third node.

11. The apparatus of claim 10, wherein the first capacitor and the second capacitor, when coupled between the first node and the third node, form part of a resonant LC tank circuit.

12. The apparatus of claim 10, wherein the oscillator circuit is a differential oscillator circuit.

13. The apparatus of claim 10, wherein the first control signal has a magnitude that is no greater than one half of a magnitude of an output signal of the oscillator circuit.

14. The apparatus of claim 10, wherein the predetermined bias voltage is sufficient to turn the switch on.

15. The apparatus of claim 10, further comprising a frequency selection module configured to output a multi-bit control word, wherein each bit of the multi-bit control word provides, at a given time, one of the first control signal or the second control signal to second ends of respective pairs of a plurality of first and second DC feed circuits.

16. A method for controlling an amount of capacitance in a circuit, comprising:
    applying a predetermined bias voltage to a control node of switch that couples together a first capacitor and a second capacitor;

applying, through a first DC feed circuit, one of a first control signal or a second control signal to a node connecting the first DC feed circuit, the first capacitor and the switch; and applying, through a second DC feed circuit, the one of a first control signal or a second control signal to a node connecting the second DC feed circuit, the second capacitor and the switch, wherein when the first control signal is applied the first capacitor and the second capacitor are coupled together and in parallel with an LC tank circuit, and when the second control signal is applied the first capacitor and the second capacitor are decoupled from one another and the LC tank circuit.

17. The method of claim 16, wherein the first control signal has a magnitude that is no greater than one half of a magnitude of an output signal of the oscillator circuit.

18. The method of claim 16, wherein the predetermined bias voltage is sufficient to turn the switch on.

19. The method of claim 16, further comprising generating a multi-bit control word, wherein each bit of the multi-bit control word provides, at a given time, one of the first control signal or the second control signal via a plurality of respective pairs of first and second DC feed circuits.

20. A frequency synthesizer having an oscillator circuit having at least one output frequency, the output frequency changing as a capacitance in the oscillator circuit varies, the frequency synthesizer comprising:
   a discretely switchable capacitance module configured to control an amount of the capacitance in the oscillator circuit, the discretely switchable capacitance module having
      a capacitor coupled between a first node and a second node;
      a switch, having a control node, coupled between the second node and a third node; and
      a DC-feed circuit, having a first end coupled to the second node and a second end configured to receive a first control signal or a second control signal,
   wherein the control node of the switch is tied to a predetermined bias voltage, and when the first control signal is applied to the second end of the DC feed circuit an AC signal of the oscillator circuit passes through the capacitor and the switch, and when the second control signal is applied to the second end of the DC feed circuit the AC signal of the oscillator circuit does not pass through the capacitor and the switch.

21. The frequency synthesizer of claim 20, further comprising a frequency selection module configured to output a multi-bit control word for controlling a plurality of discretely switchable capacitance modules, wherein each bit of the multi-bit control word provides, at a given time, one of the first control signal or the second control signal to a respective discretely switchable capacitance module.

22. A frequency synthesizer, comprising:
   a first capacitor coupled between a first node and a second node;
   a second capacitor coupled between a third node and a fourth node;
   a switch, having a control node, coupled between the second node and the fourth node;
   a first DC feed circuit, having a first end coupled to the second node and a second end configured to receive a control signal; and
   a second DC feed circuit, having a first end coupled to the fourth node and a second end configured to receive the control signal,
   wherein the control node of the switch is configured to be tied to a predetermined bias voltage, and when a first control signal is applied to the second ends of the first and second DC feed circuits, the first capacitor and the second capacitor are coupled between the first node and the third node via the switch, and when a second control signal is applied to the second ends of the DC feed circuits the first capacitor and the second capacitor are decoupled from between the first node and the third node.

23. The frequency synthesizer of claim 22, further comprising a frequency selection module configured to output a multi-bit control, wherein each bit of the multi-bit control word provides, at a given time, one of the first control signal or the second control signal to second ends of respective pairs of a plurality of first and second DC feed circuits.

24. A wireless communication system having an oscillator circuit having an output frequency, the output frequency changing as a capacitance in the oscillator circuit varies, the wireless communication system comprising:
   a discretely switchable capacitance module configured to control an amount of the capacitance in the oscillator circuit, the discretely switchable capacitance module having
      a capacitor coupled between a first node and a second node;
      a switch, having a control node, coupled between the second node and a third node; and
      a DC-feed circuit, having a first end coupled to the second node and a second end configured to receive a first control signal or a second control signal,
   wherein the control node of the switch is tied to a predetermined bias voltage, and when the first control signal is applied to the second end of the DC feed circuit an AC signal of the oscillator circuit passes through the capacitor and the switch, and when the second control signal is applied to the second end of the DC feed circuit the AC signal of the oscillator circuit does not pass through the capacitor and the switch.

25. The wireless communication system of claim 24, further comprising a frequency selection module configured to output a multi-bit control word for controlling a plurality of discretely switchable capacitance modules, wherein each bit of the multi-bit control word provides, at a given time, one of the first control signal or the second control signal to a respective discretely switchable capacitance module.

26. The wireless communication system of claim 24, wherein the communication system is a mobile telephone.

27. A communication system, comprising:
   a first capacitor coupled between a first node and a second node;
   a second capacitor coupled between a third node and a fourth node;
   a switch, having a control node, coupled between the second node and the fourth node;
   a first DC feed circuit, having a first end coupled to the second node and a second end configured to receive a control signal; and
   a second DC feed circuit, having a first end coupled to the fourth node and a second end configured to receive the control signal,
   wherein the control node of the switch is configured to be tied to a predetermined bias voltage, and when a first control signal is applied to the second ends of the first and second DC feed circuits, the first capacitor and the second capacitor are coupled between the first node and the third node via the switch, and when a second control signal is applied to the second ends of the DC feed circuits the first capacitor and the second capacitor are decoupled from between the first node and the third node.

28. The communication system of claim 27, further comprising a frequency selection module configured to output a multi-bit control, wherein each bit of the multi-bit control word provides, at a given time, one of the first control signal or the second control signal to second ends of respective pairs of a plurality of first and second DC feed circuits.

29. The communication system of claim 27, wherein the communication system comprises a mobile telephone.

30. A circuit having an output frequency, the output frequency varying as a capacitance within a discretely switchable capacitance module varies, the discretely switchable capacitance module comprising:

a capacitor coupled between a first node and a second node;
a switch, having a control node, coupled between the second node and a third node; and
a DC-feed circuit, having a first end coupled to the second node and a second end configured to receive a first control signal or a second control signal,
 wherein the control node of the switch is tied to a predetermined bias voltage, and when the first control signal is applied to the DC feed circuit an AC signal of the circuit passes through the capacitor and the switch, and when the second control signal is applied to the DC feed circuit the AC signal of the circuit does not pass through the capacitor and the switch.

* * * * *